(12) United States Patent
Voldman (10) Patent No.: US 6,946,707 B2
(45) Date of Patent: Sep. 20, 2005

(54) ELECTROSTATIC DISCHARGE INPUT AND POWER CLAMP CIRCUIT FOR HIGH CUTOFF FREQUENCY TECHNOLOGY RADIO FREQUENCY (RF) APPLICATIONS

(75) Inventor: Steven H. Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/707,954

(22) Filed: Jan. 28, 2004

(65) Prior Publication Data

US 2005/0161743 A1 Jul. 28, 2005

(51) Int. Cl.[7] ............................................. H01L 23/62

(52) U.S. Cl. ..................................................... 257/355

(58) Field of Search ................................. 257/355, 356, 257/357

(56) References Cited

U.S. PATENT DOCUMENTS 6,429,489 B1 * 8/2002 Botula et al.
6,600,356 B1 * 7/2003 Weiss

OTHER PUBLICATIONS

"Silicon Germanium Heterojunction Bipolar Transistor ESD Power Clamps and the Johnson Limit", published Proceedings of EOS/ESD Sympopsium 2002.

* cited by examiner

Primary Examiner—Nathan J. Flynn
Assistant Examiner—Kevin Quinto
(74) Attorney, Agent, or Firm—Scully, Scott, Murphy & Presser; Richard A. Henkler, Esq.

(57) ABSTRACT

A SiGe ESD (electrostatic discharge) power clamp circuit having a forward biased trigger device fabricated in a given technology and a clamp transistor preferably comprising a high frequency cutoff SiGe npn transistor, wherein the trigger device has a turn-on voltage which is below the Johnson Limit breakdown voltage of the highest frequency device fabricated in the given technology.

23 Claims, 4 Drawing Sheets

FIG. 6
SiGe ESD Power Clamp: HBT 200 GHz $f_T$ Trigger

FIG. 7
SiGe ESD Power Clamp: HBT 200 GHz $f_T$ Trigger

ELECTROSTATIC DISCHARGE INPUT AND POWER CLAMP CIRCUIT FOR HIGH CUTOFF FREQUENCY TECHNOLOGY RADIO FREQUENCY (RF) APPLICATIONS

BACKGROUND OF INVENTION

1. Field of the Invention

The present invention relates generally to an electrostatic discharge input and power clamp circuit for high cutoff frequency technology radio frequency (RF) applications. More particularly, the subject invention relates to an electrostatic discharge input and power clamp circuit for high cutoff frequency technology RF applications with low voltage trigger elements and low power applications, and utilizing a forward biased junction trigger device and a low capacitance ESD NPN clamp transistor.

2. Discussion of the Prior Art

The present invention relates generally to electrostatic discharge circuits, and more specifically pertains to electrostatic discharge power clamp circuits for high frequency RF applications.

Electrostatic Discharge (ESD) events, which can occur both during and after manufacturing of an Integrated Circuit (IC), can cause substantial damage to the IC. ESD events have become particularly troublesome for CMOS and BiCMOS chips because of their low power requirements and extreme sensitivity.

A significant factor contributing to this sensitivity to ESD is that the transistors of the circuits are formed from small regions of N-type materials, P-type materials, and thin gate oxides. When a transistor is exposed to an ESD event, the charge applied may cause an extremely high current flow to occur within the device, which can, in turn cause permanent damage to the junctions, neighboring gate oxides, interconnects and/or other physical structures.

Because of this potential damage, on chip ESD protection circuits for CMOS and BiCMOS chips is essential. In general, such protection circuits require a high failure threshold, a small layout size and a low Resistive/Capacitive (RC) delay so as to allow high speed applications.

An ESD event within an IC can be caused by a static discharge occurring at one of the power lines or rails. In an effort to guard the circuit against damage from the static discharge, circuits referred to as ESD clamps are used. An effective ESD clamp will maintain the voltage at the power line to a value which is known to be safe for the operating circuits, and not interfere with the operating circuits under normal operating conditions.

An ESD clamp circuit is typically constructed between a positive power supply (e.g. VDD) and a ground plane, or a ground plane and a negative power supply ($V_{ss}$). The main purpose of the ESD clamp is to reduce the impedance between the rails $V_{DD}$ and $V_{SS}$ so as to reduce the impedance between the input pad and the $V_{SS}$ rail (i.e. discharge of current between the input to $V_{SS}$), and to protect the power rails themselves from ESD events.

The never ending demand by consumers for increased speed in Radio Frequency (RF) devices has resulted in some unique challenges for providing ESD protection in these high speed applications. More specifically, the physical size (e.g. breakdown voltage) and loading effects of the ESD devices must now be considered in such high speed applications (e.g. 1–200 GHz range). The capacitive loading of the ESD device itself becomes a major concern for chips running at high frequencies, since the capacitive loading has an adverse effect on performance. For example, the capacitive loading effect of a typical ESD input device at a frequency of 1 GHz is 0.5 pF, 10 GHz–0.1 pF, and at 100 GHz–0.05 pF, 200 GHz–0.01 pF.

For an input pad, having a low capacitance and low trigger voltage ESD network are keys to provide ESD solutions for high speed circuits. Hence an input ESD device must have the highest performance element with the lowest capacitance and the lowest trigger condition. RF technologies can have a plurality of transistor frequencies (e.g. typically one, two or three). Moreover a high frequency transistor typically has a lower capacitance compared to a high breakdown transistor.

For an ESD power clamp, it is important to provide a low voltage trigger condition to allow for a low voltage turn-on above the power supply voltage condition. For RF CMOS, Silicon Germanium (SiGe) and Silicon Germanium Carbon (SiGeC) technologies, the frequencies of the devices are increasing. Silicon Germanium technology current gain cutoff frequencies have increased to 120, 200 and 300 GHz. As the cutoff frequency increases, the architecture of the transistor is modified to address improved performance conditions. In each technology generation, the power supply voltage is reduced as well.

Additionally, on input pins, circuits with small signal swings well below the power supply can allow for ESD input networks whose maximum signal swing is well below the BVCEO (breakdown voltage from collector to emitter) of the high $f_T$ (unity current gain cutoff frequency) transistor supported in a Bipolar or BiCMOS technology. There are transistor logic standards, such as open drain configurations, Gunning transistor logic (GTL) and potentially other standards, where the maximum voltage observed in a CMOS circuit (or BiCMOS, or pure Bipolar) network is such that the signal swing is well below the BVCEO of at least one transistor in the technology. For low power applications, the voltage can be set to a level well below the $BV_{CEO}$ of a transistor. For a SiGe transistor, a 100 GHz transistor will have a $BV_{CEO}$ of approximately 2 Volts, and a 200 GHz transistor will have a $BV_{CEO}$ of approximately 1 Volt.

Additionally, the power supply of the semiconductor chip may be reduced in a mixed signal application. In this case, the power supply condition on CMOS circuits may be reduced. Additionally, the power supply condition on the product may be reduced for power saving, power management, and low power applications. To provide good ESD protection, it is then possible to provide an ESD input pad network or an ESD power clamp below the power supply conditions.

The prior art as developed to date has been constrained by the Johnson Limit as discussed below in providing a low trigger voltage condition for ESD protection circuits, particularly on-chip ESD protection circuits for CMOS and BiCMOS chips for RF applications.

It would, therefore, be a distinct advantage to have an ESD power clamp that could provide substantial benefits in high speed device technologies and provide a low trigger voltage condition for RF applications, mixed signal environments, and low power applications. The present invention provides such an ESD clamp.

SUMMARY OF INVENTION

The present invention provides an ESD power clamp with a low trigger voltage condition for high speed, high cutoff frequency RF applications, mixed signal environments, and low power applications.

The present invention provides an ESD device that is useful in high speed radio frequency applications where turn-on voltage condition is a concern. In a preferred embodiment of the present invention, the trigger device utilizes a forward biased p-n diode device based configuration fabricated in a given technology and having a turn-on voltage that is lower than the Johnson Limit breakdown voltage of the highest frequency device fabricated in that given technology. For each technology generation the $BV_{CEO}$ of the clamp device decreases as a result of the relationship between the Johnson limit (which describes a fundamental relationship between the frequency response of a transistor device and the maximum power applied across the transistor device) and the current gain cutoff frequency.

The present invention provides an ESD device that allows a trigger condition, by a forward biased trigger device implemented in a given technology, that is not limited to the $BV_{CEO}$ of the clamping device and is not limited to the Johnson Limit breakdown voltage of the fastest device in the technology of implementation. The trigger device is forward biased which means that the trigger device is biased by a voltage to conduct in a non-breakdown, non-rectifying mode of operation.

The present invention provides an ESD device network that is suitable for implementation in CMOS, BiCMOS, or Bipolar circuits for standard or low power technologies.

BRIEF DESCRIPTION OF DRAWINGS

The foregoing objects and advantages of the present invention for an electrostatic discharge input and power clamp circuit for high cutoff frequency technology RF applications may be more readily understood by one skilled in the art with reference being had to the following detailed description of several embodiments thereof, taken in conjunction with the accompanying drawings wherein like elements are designated by identical reference numerals throughout the several views, and in which.

DETAILED DESCRIPTION

Figure 1:
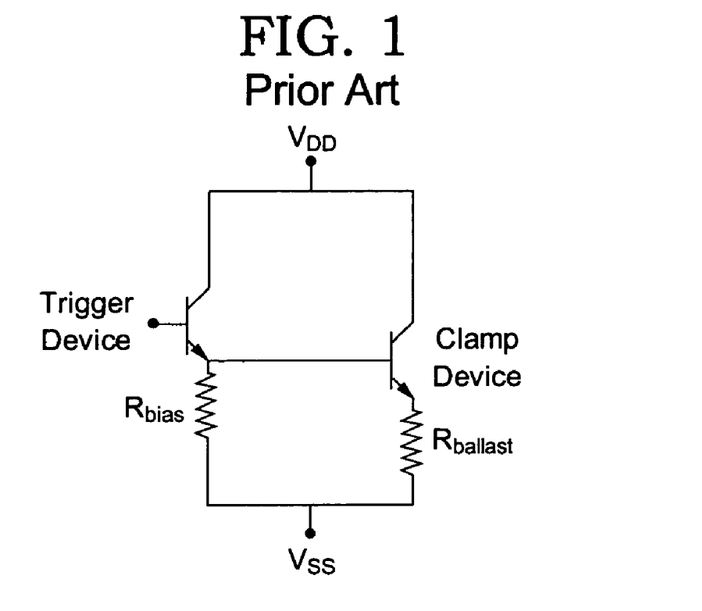
FIG. 1 illustrates an exemplary circuit of a prior art SiGe ESD power clamp wherein a first stage low breakdown transistor device serves as a trigger for a second stage high breakdown clamp transistor device.

FIG. 1 illustrates an exemplary circuit of a prior art SiGe ESD power clamp wherein a first stage low breakdown transistor device serves as a trigger for a second stage high breakdown clamp transistor device. The first stage trigger transistor has a resistor $R_{bias}$ in series therewith between power supplies $V_{DD}$ and $V_{SS}$, and the second stage clamp transistor has a resistor $R_{ballast}$ in series therewith between the power supplies $V_{DD}$ and $V_{SS}$. The circuit of FIG. 1 is a common emitter circuit with SiGe or SiGeC devices having floating bases, wherein the devices closely approximate the Johnson Limit curve.

FIG. 1 illustrates an exemplary Darlington configured bipolar power clamp circuit with a sub-native trigger voltage. For this configuration to be suitable as an ESD power clamp, we can take advantage of the inverse relationship between the $BV_{CEO}$ and the $f_T$ of the device. For a power clamp, the clamp device must have a high breakdown voltage in order to address the functional potential between the $V_{CC}$ power supply and ground potential. This power clamp requires a fT above the ESD pulse frequency to discharge the current effectively. For the trigger device, a low breakdown voltage device is needed in order to initiate base current into the clamp device at an early enough voltage.

The present invention capitalizes upon the recognition that the structural and physical characteristics of Silicon Germanium (SiGe) material and other equivalent materials (e.g. Silicon Germanium Carbon (SiGeC)) are ideal for use in an ESD clamp for high speed applications. More specifically, the present invention recognizes that the scaling of the SiGe or SiGeC heterojunction bipolar transistor is driven by both structural changes and the physical limitations of the transistor itself, and that such recognitions can be used where $BV_{CEO}$ conditions are important.

An equation $(P_m X_c)^{1/2} f^T = E_m v_s / 2\pi$ known as the Johnson Limit describes a fundamental relationship between the frequency response of the transistor and the maximum power applied across the transistor element. Pm represents the maximum power, $X_c$ represents the reactance ($X_c = 1/2\pi f_T C_{bc}$), $f_T$ represents the unity current gain cutoff frequency, Em represents the maximum electric field, and $v_s$ represents the electron saturation velocity. The equation can be transposed so that is it is expressed in terms of maximum voltage $V_m = E_m v_s / 2\pi f_T$ to illustrate the inverse relationship between the transistor speed and the allowed breakdown voltage.

Figure 2:
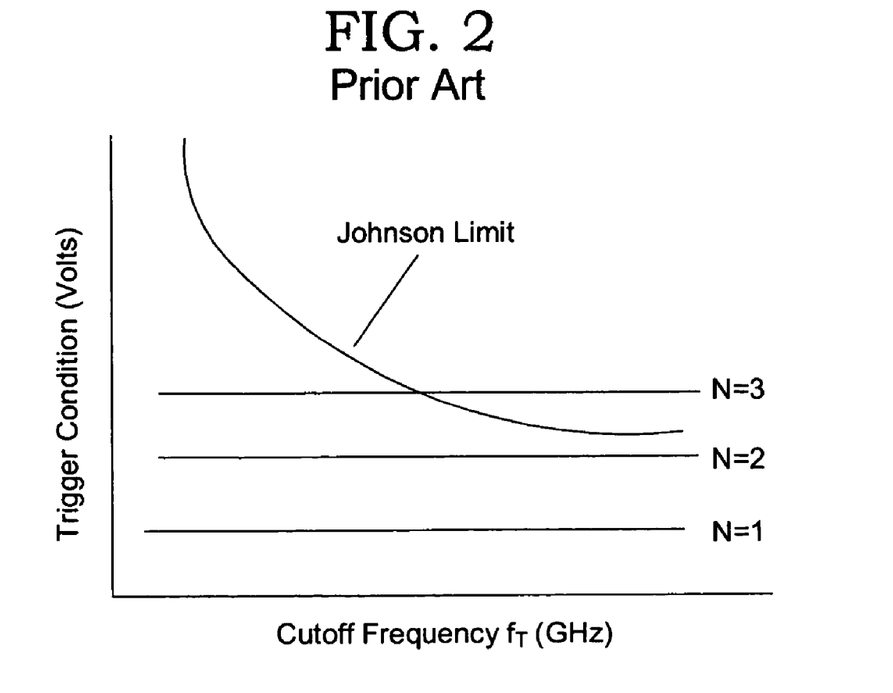
FIG. 2 is a graph of the Johnson Limit curve illustrating in greater detail the trigger conditions for the prior art implementation and a comparison of the trigger conditions for the present invention.

FIG. 2 is a graph illustrating in greater detail the Johnson Limit curve and approximations of how transistors constructed of Silicon and SiGe compare. In this diagram, the x-axis represents $f_T$, and the y-axis represents the Breakdown Voltage of the transistor from the collector-to-emitter ($BV_{CEO}$). The curve demonstrates that the $BV_{CEO}$ of the transistor decreases with an increase in the unity current gain cutoff frequency ($f_T$)

FIG. 2 is a graph illustrating the frequency cutoff and $BV_{CEO}$ characteristics of trigger and clamp devices constructed in accordance with the teachings of the present invention wherein N=1, 2 or 3 trigger and clamp devices as discussed below. As previously discussed and illustrated in FIG. 1, a transistor constructed from SiGe or SiGeC material closely approximates the Johnson Limit curve. The present invention recognizes this by developing a trigger condition of the trigger device which is lower than the Johnson Limit breakdown voltage of the fastest device in the technology of implementation and the BVCEO of the clamp device. More specifically, the present invention uses a first ESD trigger circuit and a second ESD device having a high $f_T$/low $BV_{CEO}$. In this configuration, the capacitive loading of the ESD input device is reduced to a respectable level. This can provide an ESD clamp device placed on the power rail having a low voltage power clamp.

ESD trigger device is preferably a forward biased junction element in Si or SiGe or SiGeC and comprises the following general categories of junction elements:
1. CMOS, BiCMOS and RF CMOS diodes, including Si LOCOS defined pn diodes, Si shallow trench isolation defined pn diodes with a medium or deep trenches, polysilicon gate defined pn diodes, all of which can be in Si, SiGe or SiGeC technologies, in either P well or N well, and all of which can include features of subcollectors, trench isolation, with medium or deep trench structures;
2. bipolar devices, including Si, SiGe or SiGeC diode configured bipolar npn or pnp transistors as two element components, Si, SiGe or SiGeC varactors, usually configured base-collector;
3. Schottky diodes in either Si, SiGe or SiGeC;
4. MOSFETs, in either P channel or N channel, including low voltage trigger MOSFETs, gate modulated pseudo-zero VT MOSFETs, depletion MOSFETs and dynamic threshold MOSFET diodes.

Figure 3:
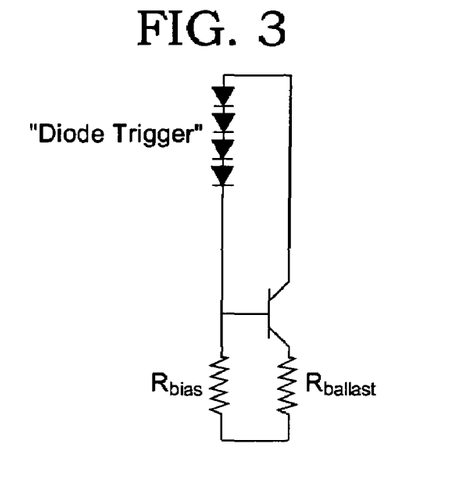
FIG. 3 is a schematic diagram illustrating one embodiment of an ESD clamp constructed in accordance with the teachings of the present invention utilizing a SiGe based varactor or diode trigger network.

FIG. 3 is a schematic diagram illustrating an ESD clamp constructed in accordance with the teachings of the present invention utilizing a SiGe based varactor or diode trigger network with a sub-native trigger voltage. In the embodiment of FIG. 3, one SiGe varactor element, or a number of SiGe varactor elements placed in series, are used as the trigger device in an ESD clamp circuit.

Utilization of a single varactor element allows the trigger condition to be set at a minimum turn-on voltage of the varactor (e.g. 0.7 Volts), plus the turn on voltage of the SiGe (or SiGeC) emitter base voltage of the clamp element (e.g. 0.7 Volts) leading to a turn on voltage of 1.4 Volts. This trigger condition can be increased by adding more varactor elements in series. Hence states of 1.4, 2.1, and 2.8 V are achievable with additional elements. Adding more elements reduces the observed capacitance of the trigger element, but impacts the turn-on voltage and the size of the structure. The capacitance of the varactor structure can be reduced by utilizing the trench and non-subcollector solutions as discussed herein.

An alternative embodiment can use an SiGe npn transistor with its emitter base shorted, and utilize the base-collector Vbc voltage to provide the trigger condition, or alternatively, to provide a lower capacitance trigger, the base-emitter junction of a SiGe npn device can be utilized which has a lower capacitance than the base-collector junction. For input pad applications, usage of this network provides a low capacitance trigger network reducing the device loading shorting (or across) the base-collector.

More generally, the trigger condition can be provided by a diode configured npn SiGe transistor (using the base-emitter voltage with the collector-base shorted, or a diode configured pnp SiGe transistor (using the emitter-base voltage with the collector-base shorted, or the collector-base voltage with the emitter-base shorted).

For the trigger and clamp devices, the frequency response of the clamping device is not critical for ESD applications. The capacitance of the subcollector can be reduced by using a medium depth trench isolation whose depth extends shallower than the subcollector depth. Additionally, the ESD trigger element or ESD Clamp element can achieve a lower capacitance by an extension of the trench isolation well below the subcollector junction depth. Additionally, the trigger element can achieve a lower capacitance by elimination of the subcollector implant from the collector region. Elimination of the subcollector implant reduces the collector-to-substrate capacitance thereby lowering the trigger element capacitance. This provides a lower capacitance ESD network for the trigger element and the clamp element.

The use of a lower breakdown voltage trigger device ensures the turning on of the trigger element prior to the turning on of the clamp element. This is important because the turning on of the clamp element prevents a non-uniform current constriction within the clamp element from adversely affecting the ESD robustness with increased scaling of the clamp element length in high frequency applications.

Figure 4:
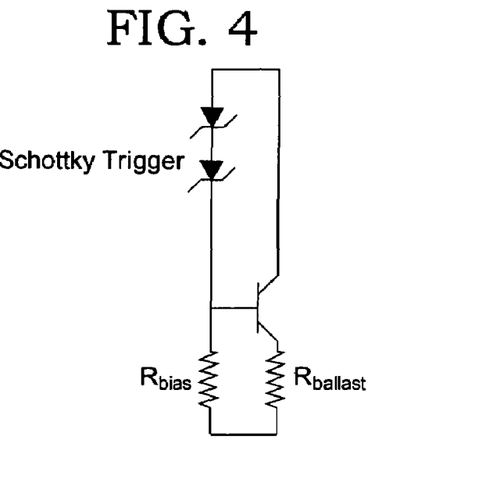
FIG. 4 is a schematic diagram illustrating another embodiment of an ESD clamp constructed in accordance with the teachings of the present invention utilizing a Schottky diode trigger network.

FIG. 4 is a schematic diagram of another embodiment of an ESD clamp constructed in accordance with the teachings of the present invention utilizing a Schottky diode trigger network with a sub-native trigger voltage.

A SiGe-based Schottky diode network provides a lower trigger voltage than a CMOS diode, a SiGe npn or a diode configured SiGe transistor or a SiGe varactor structure. By utilizing a single Schottky diode, a trigger condition can be set to 0.3 V plus the Vbe of the SiGe clamp transistor (0.9 Volts). Additionally, by placing multiple Schottky diodes in series, trigger conditions of 0.9, 1.2, and 1.5 V are obtainable with 1, 2, and 3 Schottky diodes placed in series. The Schottky diode capacitance can be reduced by trench isolation, and subcollector elimination (non-subcollector implementation) of the Schottky structure.

The present invention can selectively combine and mix diode-configured SiGe npn transistors, SiGe based varactors and Schottky based elements in series to achieve different trigger conditions. Hence it should be apparent that a hybrid network of these elements in a series configuration can provide selected new voltage conditions as well as capacitance loading advantages.

Utilization of the ESD circuit in CMOS or RF CMOS networks provides the trigger element and clamp element with a higher frequency response while making them less sensitive to spurious noise spikes and electrostatic emissions (EMI) events.

The ballast resistor $R_{ballast}$ is placed in series with the clamp device, and is used in a conventional fashion for providing emitter stability, voltage limitations, thermal stability, and ESD stability.

The bias resistor $R_{bias}$ is placed in series with trigger device, and is used to maintain the base of the clamp device at a low potential in order to limit the amount of current that flows through the trigger device during an ESD event.

Formation of a trigger device and clamp transistor can be initiated using two different collector designs in a common process.

Figure 5:
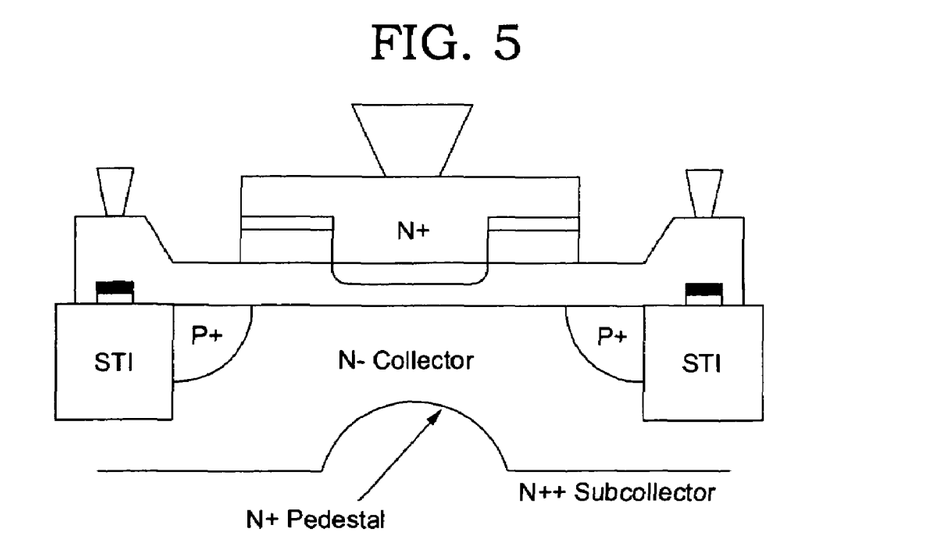
FIG. 5 is a cross sectional view and diagram of an implementation of the clamp device as a SiGe Heterojunction Bipolar Transistor (HBT) according to the teachings of the present invention.

FIG. 5 is a cross sectional view of an implementation of the trigger device as a SiGe varactor according to the teachings of the present invention. The SiGe varactor is formed on a n++ subcollector. The SiGe epitaxial film is placed on the silicon surface forming the extrinsic base over the STI isolation and the intrinsic base region over the single crystal silicon region. An n+pedestal implant is formed through the emitter window.

FIG. 5 illustrates a SiGe HBT (Heterojunction Bipolar Transistor) structure. The SiGe HBT devices are designed on a p− substrate. An n++ subcollector is formed in the p− substrate followed by an epitaxial growth. Shallow trench isolation and deep trench isolation are formed prior to the epitaxial base SiGe film growth. A first n+ pedestal implant is done to allow the collector implants to move closer to the silicon surface. The SiGe epitaxial film is placed on the silicon surface forming the extrinsic base over the STI isolation and the intrinsic base region over the single crystal silicon region. To form a high fT SiGe HBT device, a second n+ pedestal region is implanted through the emitter window of only one SiGe HBT.

The pedestal implant is typically formed to reduce the Kirk effect. The Kirk effect is due to a high current density which forces the space charge region of the base-collector junction to get pushed into the collector region. This reduces the frequency response of the transistor. To prevent this, the extra pedestal implant is placed so to maintain a high $f_T$ device, which in turn causes a low $BV_{CEO}$ breakdown voltage. As a result, the high $f_T$/low $BV_{CEO}$ device can serve as a frequency responsive low breakdown voltage for the trigger of the Darlington configured network. The second transistor which does not have the second pedestal implant can serve as the high $BV_{CEO}$/low fT device. Obviously, more pedestal implants can be added to lower the $BV_{CEO}$ until a desired level is obtained. The SiGe varactor without the pedestal implant allows for a lower capacitance and lower leakage structure for a low capacitance ESD element.

In this embodiment, Si diodes can be utilized where the anode is a shallow trench isolation defined p+ implant, and the cathode is a shallow trench isolation defined implant. This can utilize medium depth trench isolation and deep trench isolation for the sidewall of the element's cathode structure for latchup, isolation, injection and density advantages. This Si diode element can utilize n-wells, p-wells, n+ subcollector structures, collector structures, and trench structures for ESD and capacitance reduction advantages.

The SiGe HBT ESD Power Clamp network trigger network consists of a high fT SiGe HBT with a bias resistor. When the transistor collector-to-emitter voltage is below the breakdown voltage, no current is flowing through the trigger transistor. The bias resistor holds the base of the SiGe HBT clamp transistor to a ground potential. With no current flowing, the output clamp can be visualized as a grounded base npn device between the power supplies. When the voltage on $V_{CC}$ exceeds the collector-to-emitter breakdown voltage, $BV_{CEO}$, in the high $f_T$ SiGe HBT, current flows into the base of the SiGe HBT high breakdown device. This leads to discharging of the current on the $V_{CC}$ electrode to the $V_{SS}$ ground electrode.

In the case with no trigger device, the SiGe HBT power clamp will undergo breakdown according to the condition similar to the grounded base npn transistor in common emitter configuration. To quantify the condition of snapback of the clamp element, the terminal conditions when the partial derivative of the terminal current with respect to the terminal voltage goes to infinity. Assuming no ballasting resistor and no base resistance, it can be shown that $$\frac{\partial I}{\partial V} = \frac{\frac{\partial M}{\partial V}\{\alpha\; I_E + I_{gen}\}}{\left[1 - \frac{\alpha M}{1 + \frac{1}{R_{bias}}\frac{kT}{q}I_E}\right]} \to \infty$$

where the avalanche condition is modified by the bias resistor as $$\alpha\, M = 1 + \frac{1}{R_{bias}}\frac{kT}{q}\frac{1}{I_E}$$

This sets a $BV_{CER}$ condition on the clamp device as $$BV_{CER} = BV_{CBO} \sqrt[n]{1 - \frac{\alpha}{1 + \frac{kT}{q}\frac{1}{R_{bias}}\frac{1}{I_E}}}$$

This condition is the case where the base resistance is negligible. In our implementation, the trigger device will be lower than the BVCER value when a high fT/low $BV_{CEO}$ device is used. If the same transistor is used, the trigger device will be in a floating-base configuration, and the clamp device will be in the above condition with the additional current source from the triggering transistor. The bias resistor causes the clamp device to exceed the floating base condition. As the bias resistor increases, eventually, the clamp voltage will begin to appear as an open-base type condition. For an open-base trigger element, the collector current equals the emitter current with the condition of $$I_{C_{Trigger}} = I_{E_{Trigger}} = \frac{MI_{co}(1+\beta)}{1 - \beta(M-1)}$$

where the current gain is the current gain of the trigger device. This current serves as the base current to the clamp transistor. If we assume that the current flow through the bias transistor is small, this current will flow into the base of the clamp device. In the condition that the clamp is not in an avalanche state, and the trigger device is the current through the clamp is $$I_{C_{Clamp}} = \beta_{Clamp} \frac{MI_{co}(1+\beta_{TR})}{1 - \beta_{TR}(M-1)}$$

As the voltage exceeds the breakdown voltage of the clamp element, both the trigger and clamp device will be in an avalanche state. In this condition a more general expression is need to quantify the operation.

Alternative embodiments of both the clamp and trigger devices can be created by adding additional pedestal and/or CMOS N-well implants. For example, such implants could be used to create three distinct transistors, each having a differing fT.

Alternative embodiments of both the clamp and trigger devices can be created by adding additional pedestal and/or CMOS N-well implants.

Figure 6:
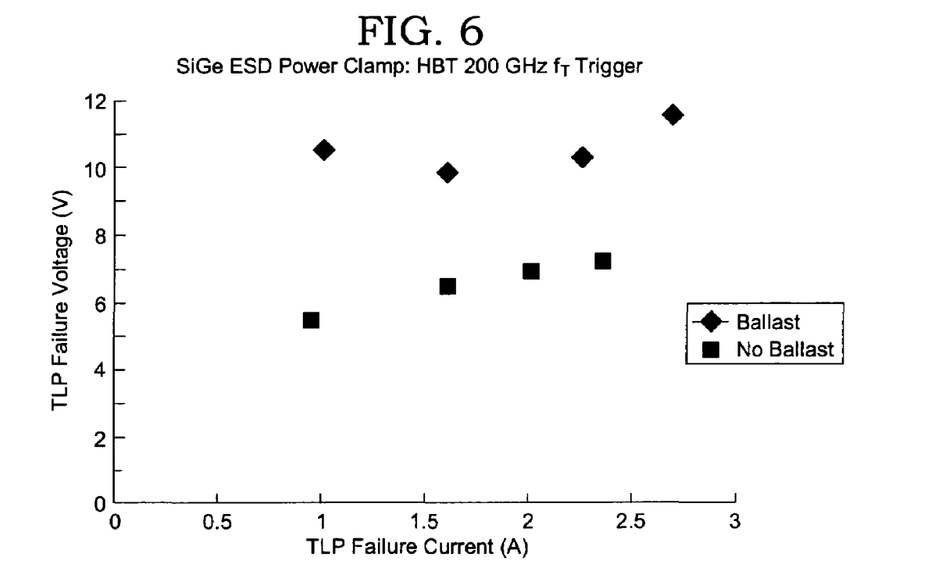
FIG. 6 shows graphs of experimental results illustrating the operability of the present invention.
Figure 7:
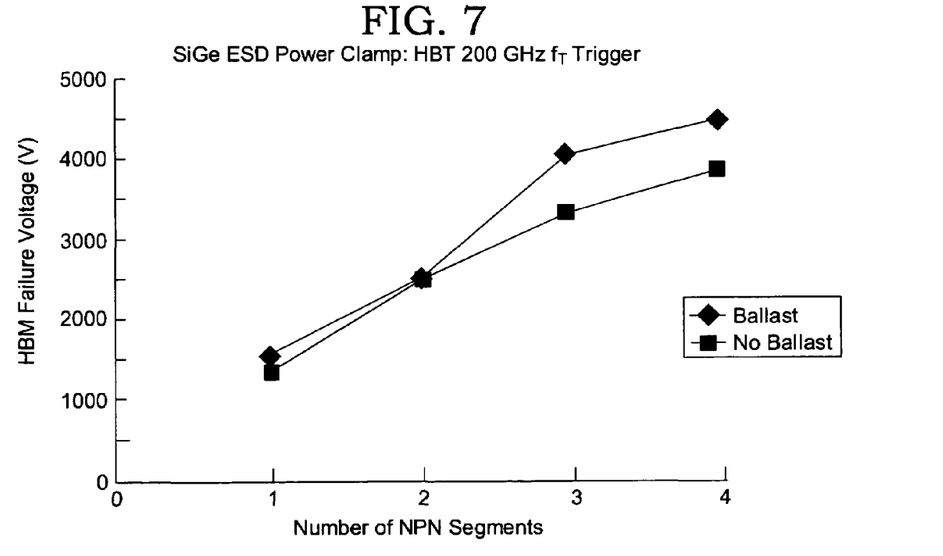
FIG. 7 shows graphs of experimental results illustrating the operability of the present invention.

FIGS. 6 and 7 show illustrations of the operability of the ESD network discussed in FIG. 3. Transmission line pulse (TLP) testing results show the operation with and without ballasting resistors. In this embodiment, the size of the structure was modified to determine ESD scaling results. These measurements are from the IBM SiGe 8T technology utilizing a 200 GHz ft transistor element as the clamp element and a 200 GHz $f_T$ transistor trigger element, which is in a B-C diode configuration (E-B shorted).

Figure 8:
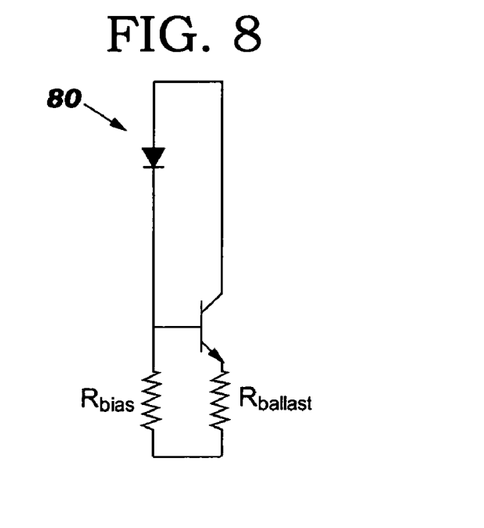
FIG. 8 is a schematic diagram illustrating another embodiment of an ESD clamp constructed in accordance with the teachings of the present invention utilizing a BiCMOS p-n diode trigger network.

FIG. 8 is a schematic diagram illustrating another embodiment of an ESD clamp constructed in accordance with the teachings of the present invention utilizing an BiCMOS diode trigger network 80. BiCMOS diodes can consist of shallow trench isolation (STI) defined p+ anode and STI-defined n+ cathode region. This structure can exist in a p-well or an n-well. In the case of the n-well region, the n-well tub becomes the cathode structure and the STI-defined region becomes the electrical contact to the n-well region. An additional n++ sub-collector can be placed in the n-well region or additional n-implants. The n-well region can be in a p-substrate. The edges of the n-well region can consists of n+ reach-through implants, trench isolation (TI), or deep trench (DT) structures. In the case of a p-well, the p-well becomes the anode structure and the STI-defined n+ region becomes the cathode structure. This p-well can be bound by an n-well edge, a n+ reach-through, an n− band, a sub-collector, trench isolation (TI) or deep trench (DT) isolation. In this implementation, a single element or a plurality of elements in a series configuration can be used.

Figure 9:
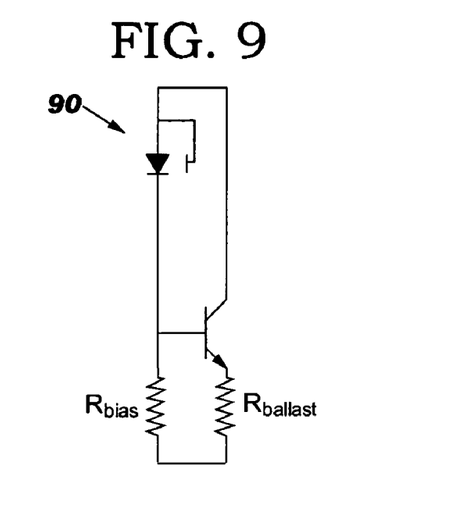
FIG. 9 is a schematic diagram illustrating another embodiment of an ESD clamp constructed in accordance with the teachings of the present invention utilizing a lateral polysilicon-bound diode trigger network.

FIG. 9 is a schematic diagram illustrating another embodiment of an ESD clamp constructed in accordance with the teachings of the present invention utilizing a BiCMOS lateral polysilicon-bound gated diode trigger network 90. In this structure, instead of the p+ anode and n+ cathode being defined by the shallow trench isolation (STI), a polysilicon MOSFET gate structure serves as a means to define the anode and cathode connections. In this case, the lateral p-n diode is formed using a thin dielectric with a polysilicon film and spacer forming a MOSFET polysilicon gate structure. Source and drain implants as well as halos, low-doped drain implants, extension implants and other MOSFET angled implants that form the MOSFET drain structure are present in the polysilicon gated diode structure. The gate structure has the p+ implants on half of the polysilicon film, and the n+ implants on the other half of the polysilicon film, which is achieved using the block masks used for MOSFET n- and p-channel device formation. This structure can exists in a p-well or an n-well. In the case of the n-well region, the n-well tub becomes the cathode structure and the polysilicon-defined region becomes the electrical contact to the n-well region. An additional n++ sub-collector can be placed in the n-well region or additional n-implants. The n-well region can be in a p-substrate. The edges of the n-well region can consists of n+ reach-through implants, trench isolation (TI), or deep trench (DT) structures. In the case of a p-well, the p-well becomes the anode structure and the polysilicon-defined n+ region becomes the cathode structure. This p-well can be bound by an n-well edge, an n+ reach-through, an n− band, a sub-collector, trench isolation (TI) or deep trench (DT) isolation. In this implementation, a single element or a plurality of elements in a series configuration can be used.

Figure 10:
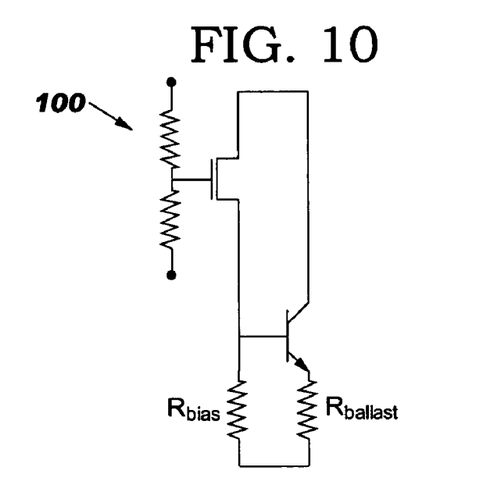
FIG. 10 is a schematic diagram illustrating another embodiment of an ESD clamp constructed in accordance with the teachings of the present invention utilizing a pseudo-zero $V_T$ MOSFET trigger network

FIG. 10 is a schematic diagram illustrating another embodiment of an ESD clamp constructed in accordance with the teachings of the present invention utilizing a pseudo-zero $V_T$ MOSFET trigger network 100. In this implementation, a MOSFET with a gate control network can be used to serve as a trigger voltage. The MOSFET element is placed between the power supply voltage $V_{DD}$ and the bipolar base node. A reference control network consisting of resistors or other elements in a resistive configuration sets the voltage to allow turn-on of the MOSFET. This voltage reference can be set to define the turn-on voltage of the network. In this implementation, a single element or a plurality of elements in a series configuration can be used.

Figure 11:
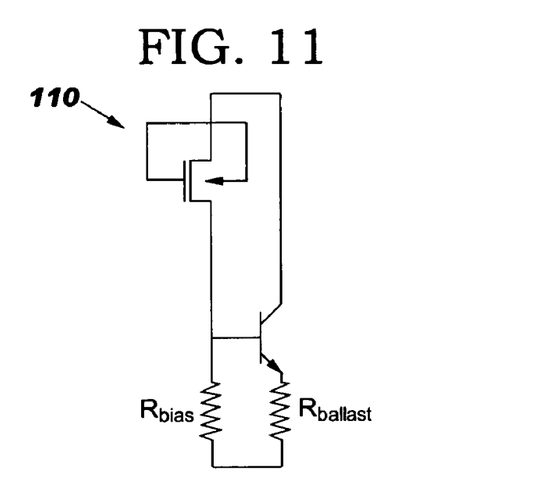
FIG. 11 is a schematic diagram illustrating another embodiment of an ESD clamp constructed in accordance with the teachings of the present invention utilizing a dynamic threshold MOSFET trigger network.

FIG. 11 is a schematic diagram illustrating another embodiment of an ESD clamp constructed in accordance with the teachings of the present invention utilizing a dynamic threshold MOSFET trigger network 110. In this embodiment, the MOSFET gate, drain and body are all connected to the $V_{DD}$ node and the source is connected to the base of the bipolar transistor. As the body rises, the threshold voltage of the MOSFET turns on. As the body rises, the threshold decreases, and the current drive of the MOSFET increases due to a larger $V_G$–$V_T$ increase. This provides a low voltage trigger element which can be below the Johnson Limit condition of the bipolar elements. In this embodiments, the dynamic threshold MOSFET can be a singular element or a plurality of elements in a series configuration for the trigger circuit.

While several embodiments and variations of the present invention for an electrostatic discharge input and power clamp circuit for high cutoff frequency technology RF applications are described in detail herein, it should be apparent that the disclosure and teachings of the present invention will suggest many alternative designs to those skilled in the art.

What is claimed is:

1. An electrostatic discharge device comprising:
   a forward biased trigger device fabricated in a given technology, wherein the trigger device is forward biased by a voltage to conduct in a non-breakdown, non-rectifying mode of operation;
   a clamp transistor coupled to the trigger device so that activation of the trigger device activates the clamp transistor, the clamp transistor having a cutoff frequency which determines its Johnson Limit breakdown voltage;
   the trigger device being fabricated in the given technology and having a trigger activation voltage above which the trigger device activates the clamp transistor, with the trigger activation voltage being below the Johnson Limit breakdown voltage of the highest frequency device fabricated in the given technology.

2. The electrostatic discharge device of claim 1, wherein the trigger device is coupled to the base of the clamp transistor.

3. The electrostatic discharge device of claim 1, wherein the trigger device is constructed of a silicon germanium material.

4. The electrostatic discharge device of claim 1, wherein the clamp transistor is constructed of a silicon germanium material.

5. The electrostatic discharge device of claim 1, wherein the trigger device and the clamp transistor are coupled between an input pad and a ground.

6. The electrostatic discharge device of claim 1, wherein the trigger device and the clamp transistor are coupled between a power rail and a ground rail.

7. The electrostatic discharge device of claim 1, wherein the trigger device and the clamp transistor are coupled between a first power source and a second power source.

8. The electrostatic discharge device of claim 1, wherein the trigger device is constructed of a plurality of trigger elements in a series configuration.

9. The electrostatic discharge device of claim 1, wherein the trigger device includes at least one forward biased junction element in the group consisting of Si, SiGe and SiGeC.

10. The electrostatic discharge device of claim 1, wherein the trigger device includes at least one forward biased junction element in the group consisting of CMOS diodes, BiCMOS diodes, RF CMOS diodes, bipolar devices including Si, SiGe and SiGeC diode configured bipolar transistors and varactors, Schottky diodes in Si, SiGe and SiGeC, and MOSFETs.

11. A method of fabricating electrostatic discharge protection in an integrated circuit comprising the steps of:
fabricating a forward biased trigger device in a given technology in the integrated circuit;
fabricating a clamp transistor coupled to the trigger device in the integrated circuit so that activation of the trigger device activates the clamp transistor, the clamp transistor having a cutoff frequency which determines its Johnson Limit breakdown voltage;
fabricating the trigger device in the given technology to have a trigger activation voltage above which the trigger device activates the clamp transistor, with the trigger device being forward biased by a voltage to conduct in a non-breakdown, non-rectifying mode of operation, and the trigger activation voltage being below the Johnson Limit breakdown voltage of the highest frequency device fabricated in the given technology.

12. The method of claim 11, including fabricating the trigger device and the clamp transistor of a silicon germanium material.

13. The method of claim 11, including coupling the trigger device and the clamp transistor between an input pad and a ground.

14. The method of claim 11, including coupling the trigger device and the clamp transistor between a power source and a ground.

15. The method of claim 11, including fabricating the trigger device as at least one forward biased junction element in the group consisting of Si, SiGe and SiGeC.

16. The method of claim 11, including fabricating the trigger device as at least one forward biased junction element in the group consisting of CMOS diodes, BiCMOS diodes, RF CMOS diodes, bipolar devices including Si, SiGe and SiGeC diode configured bipolar transistors and varactors, Schottky diodes in Si, SiGe and SiGeC, and MOSFETs.

17. A semiconductor device comprising:
a first rail for providing a first voltage source;
a second rail for providing a second voltage source;
functional circuitry, coupled between the first and second rails, for performing an electrical function;
electrostatic discharge circuitry, coupled between the first and second rails, for diverting electrostatic discharges from the functional circuitry onto either the first or second rail, the electrostatic discharge circuitry including:
a forward biased trigger device fabricated in a given technology, wherein the trigger device is forward biased by a voltage to conduct in a non-breakdown, non-rectifying mode of operation;
a clamp transistor coupled to the trigger device so that activation of the trigger device activates the clamp transistor, the clamp transistor having a cutoff frequency which determines its Johnson Limit breakdown voltage;
the trigger device having a trigger activation voltage above which the trigger device activates the clamp transistor, with the trigger activation voltage being below the Johnson Limit breakdown voltage of the highest frequency device fabricated in the given technology.

18. The semiconductor device of claim 17, wherein the trigger device and transistor are constructed of a silicon germanium material.

19. The semiconductor device of claim 17, wherein the trigger device includes at least one forward biased junction element in the group consisting of Si, SiGe and SiGeC.

20. The semiconductor device of claim 17, wherein the trigger device includes at least one forward biased junction element in the group consisting of CMOS diodes, BiCMOS diodes, RF CMOS diodes, bipolar devices including Si, SiGe and SiGeC diode configured bipolar transistors and varactors, Schottky diodes in Si, SiGe and SiGeC, and MOSFETs.

21. An integrated circuit comprising:
a first rail for providing a first voltage source;
a second rail for providing a second voltage source;
functional circuitry, coupled between the first and second rails, for performing a desired function;
electrostatic discharge circuitry, coupled between the first and second rails, for diverting electrostatic discharges from the functional circuitry onto either the first or second rail, the electrostatic discharge circuitry including:
a forward biased trigger device fabricated in a given technology, wherein the trigger device is forward biased by a voltage to conduct in a non-breakdown, non-rectifying mode of operation;
a clamp transistor coupled to the trigger device so that activation of the trigger device activates the clamp transistor, the clamp transistor having a cutoff frequency which determines its Johnson Limit breakdown voltage;
the trigger device having a trigger activation voltage above which the trigger device activates the clamp transistor, with the trigger activation voltage being below the Johnson Limit breakdown voltage of the highest frequency device fabricated in the given technology.

22. The integrated circuit of claim 21, wherein the trigger device includes at least one forward biased junction element in the group consisting of Si, SiGe and SiGeC.

23. The semiconductor device of claim 21, wherein the trigger device includes at least one forward biased junction element in the group consisting of CMOS diodes, BiCMOS diodes, RF CMOS diodes, bipolar devices including Si, SiGe and SiGeC diode configured bipolar transistors and varactors, Schottky diodes in Si, SiGe and SiGeC, and MOSFETs.

* * * * *